(12) United States Patent
Fujioka et al.

(10) Patent No.: US 6,436,797 B1
(45) Date of Patent: Aug. 20, 2002

(54) APPARATUS AND METHOD FOR FORMING A DEPOSITED FILM ON A SUBSTRATE

(75) Inventors: Yasushi Fujioka, Souraku-gun; Shotaro Okabe, Nara; Masahiro Kanai, Tokyo; Akira Sakai; Tadashi Sawayama, both of Souraku-gun; Yuzo Koda, Kyotanabe; Takahiro Yajimaa, Souraku-gun, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/578,906

(22) Filed: May 26, 2000

(30) Foreign Application Priority Data

May 27, 1999 (JP) ............................................. 11-147600
Mar. 24, 2000 (JP) ....................................... 2000-084242

(51) Int. Cl.$^7$ ............................................. H01L 21/20
(52) U.S. Cl. ................................... 438/484; 118/723 E
(58) Field of Search ............................... 438/57, 61, 62, 438/484, 485, 907; 427/74, 575, 578; 118/718, 719, 723 R, 723 E (56) References Cited

U.S. PATENT DOCUMENTS 4,400,409 A    8/1983  Izu et al. ....................... 427/39
4,519,339 A  * 5/1985  Izu et al.
4,933,203 A  * 6/1990  Curtins
6,031,198 A    2/2000  Moriyama et al. ..... 219/121.57

OTHER PUBLICATIONS

Shah, et al., "VHF Plasma Deposition: A Comparative Overview", Mat. Res. Soc. Symp. Proc. Vol. 258, Apr.–May 1992, pp. 15–25 (1992).

* cited by examiner

*Primary Examiner*—Keith Christianson
(74) *Attorney, Agent, or Firm*—Fitzpatrick, Cella, Harper & Scinto

(57) ABSTRACT

A film-forming apparatus for forming a non-single crystalline silicon series semiconductor film on a substrate in a film-forming space provided in a vacuum chamber using a very high frequency power supplied through a high frequency power supply means comprising a bar-like shaped electrode, wherein said bar-like shaped electrode is arranged such that the longitudinal direction thereof intersects a direction for said substrate to be moved, and a length of said film-forming space relative to the direction for said substrate to be moved is in a range of from $\frac{1}{16}$ to $\frac{1}{2}$ of a wavelength of said very high frequency power supplied in said film-forming space. A film-forming method for forming a non-single crystalline silicon series semiconductor film on a substrate using said film-forming apparatus.

12 Claims, 4 Drawing Sheets

APPARATUS AND METHOD FOR FORMING A DEPOSITED FILM ON A SUBSTRATE

BACKGROUND OF THE INVENTION

1. Field of the Invention

The present invention relates to an apparatus and method for forming a functional deposited film on a substrate. More particularly, the present invention relates to an apparatus and method for forming a semiconductor deposited film, representatively, such as an amorphous silicon series semiconductor deposited film (the term "semiconductor deposited film" will be hereinafter referred to as "semiconductor film" for simplification purpose) on a desired substrate, which is suitable for use in a semiconductor device such as a thin film solar cell or the like, by way of plasma chemical vapor deposition (hereinafter referred to as plasma CVD). Such amorphous silicon series semiconductor film includes, for instance, an amorphous silicon semiconductor film, an amorphous silicon-germanium semiconductor film, an amorphous silicon carbide semiconductor film, and a microcrystalline silicon semiconductor film.

2. Related Background Art

It is known that an amorphous silicon semiconductor film having a large area can be formed by way of plasma CVD and therefore, a large area amorphous silicon semiconductor device amorphous can be relatively easily formed in comparison with the case of forming a large area single crystalline or polycrystalline silicon semiconductor device. In fact, amorphous silicon semiconductor films have been often used in the preparation of various semiconductor devices required to have a large area, such as solar cells, photosensitive members (or light receiving members) for copying machines, image sensors for facsimiles, and liquid crystal displays having a thin film transistor. These semiconductor devices are greater than semiconductor devices comprising a crystalline semiconductor such as LSI, CCD, and the like in terms of the length or area as a single device. For instance, in the case of a solar cell, when said solar cell is supposed to have a photoelectric conversion efficiency of 10% in order for a general household to be furnished with a house hold power of about 3 kW, it is necessary to establish a power generation area of about 30 m$^2$ by using a plurality of solar cells. In this case, each solar cell is necessary to have a considerably large area.

Now, in order to form an amorphous silicon film, there is generally adopted a film-forming method wherein a silicon (Si)-containing raw material gas such as $SiH_4$, $Si_2H_6$, or the like is introduced into a deposition space in which a substrate on which a film is to be formed is arranged, and said raw material gas is decomposed by supplying a high frequency power thereto to case plasma discharge, whereby forming an amorphous silicon film on said substrate, where an RF power with an oscillation frequency of near 13.56 MHz is generally used as the high frequency power.

Here, recently, plasma CVD using a VHF (very high frequency) power has attracted public attention. For instance, in *Amorphous Silicon Technology* 1992, pp. 15–16 (Materials Research Society Symposium Proceedings Volume 258), there is described that by changing the discharging frequency from RF of 13.56 MHz to VHF, the film deposition rate can be markedly heightened and a good deposited film can be formed at a high speed.

In order to continuously form an amorphous silicon series semiconductor device, there are known a number of apparatus for continuously forming an amorphous silicon series deposited film on a long substrate (for example, a web substrate) to obtain an amorphous silicon series semiconductor device. As a representative example of such apparatus, there can be mentioned a so-called roll-to-roll type continuous plasma CVD apparatus as disclosed, for instance, in U.S. Pat. No. 4,400,409. The roll-to-roll type continuous plasma CVD apparatus described in this document comprises a plurality of glow-discharging chambers (film-forming chambers in other words) communicated with each other. In said document, there is described that large area semiconductor devices having a desired semiconductor junction can be continuously formed by continuously transporting a long web substrate having a desired width in the longitudinal direction along a route of sequentially passing through the glow-discharging chambers. In the case of using such roll-to-roll type continuous plasma CVD apparatus, desired semiconductor devices can be continuously produced over a long period of time without suspending the operation of the apparatus. Thus, there can be attained high productivity.

Now, a VHF plasma CVD method capable of performing film deposition at a high speed is intended to adopt in a plasma CVD apparatus, it is necessary to take into account such items as will be described below.

The term "VHF plasma CVD method" means a plasma-assisted chemical vapor deposition method using a very high frequency (VHF) power as a plasma discharging power.

Now, in order to generate uniform discharge over a large area, when a discharge electrode in a plate form, which is generally used in the case of using a high frequency lying in an RF (radio-frequency) band region (hereinafter simply referred to as "RF"), is used, the impedance is not desirably increased and it is difficult for the electrode to efficiently supply a desired electric power in the case of using a high frequency lying in a very high frequency (VHF) band region (hereinafter simply referred to as "VHF"). Therefore, it is necessary to use a bar-like shaped antenna or a radial antenna respectively having a small surface area as the discharge electrode for the VHF power in the plasma discharging chamber (the film-forming chamber) of the plasma CVD apparatus. However, in the case where such electrode is used, it is difficult to attain an uniform plasma intensity distribution over a large area in comparison with the case of using the plate electrode and therefore, it is difficult to continuously deposit a desired semiconductor film uniformly over a large area in the film-forming chamber (the discharging chamber) of the plasma CVD apparatus. In addition, the wavelength of VHF is shorter than that of RF and it is, for instance, 100 cm for 300 MHz as a VHF. In this connection, the wavelength emitted approximates the size of the film-forming chamber in which film deposition is performed, where when standing wave is formed, a varied plasma intensity distribution is more liable to occur in comparison with the case of using RF.

Further, in the case of performing film deposition while continuously moving the substrate as in the case of the foregoing roll-to-roll type continuous plasma CVD apparatus, there is an occasion that plasma generated in a given film-forming chamber (a given discharging chamber) becomes uneven in the direction for the substrate to be transported. Such unevenness of the plasma is rectified by virtue of continuous movement of the substrate and because of this, said unevenness of the plasma does not appear as an unevenness for the thickness distribution of a film deposited. However, in this case, because the film deposition in said film-forming chamber takes place under such plasma condition that is varied in the thickness direction for a film deposited therein due to the unevenness of the plasma in the direction for the substrate to be transported, there is a tendency that a deposited film obtained becomes to have an uneven film property in the thickness direction. Thus, there is an disadvantage in that it is not always ensured to continuously form a desirable deposited film having an uniform film property in the thickness direction.

SUMMARY OF THE INVENTION

An principal object of the present invention is to eliminate the foregoing disadvantages in the prior art in the case where a VHF plasma CVD method is adopted and to provide a film-forming apparatus and method in which a VHF plasma CVD method capable of performing film deposition at a high speed can be desirably adopted and which make it possible to efficiently form a large area semiconductor film having a substantially uniform film property in the thickness direction at a high speed even when a bar-like shaped electrode having a small surface area is used as the discharge electrode for the VHF frequency power.

Another object of the present invention is to provide a film-forming apparatus and method in which a VHF plasma CVD method capable of performing film deposition at a high speed can be desirably adopted and which make it possible to afford an uniform plasma intensity distribution over a large area even when a bar-like shaped electrode having a small surface area is used as the discharge electrode for the VHF power, where a semiconductor film having a substantially uniform film property in the thickness direction can be efficiently over the entire surface of a large area substrate at a high speed.

A further object of the present invention is to provide a film-forming apparatus comprising at least a vacuum chamber having a film-forming space provided therein, a high frequency power supply means, and a raw material gas introduction means and in which a non-single crystalline silicon series semiconductor film is formed on a substrate positioned in said film-forming space by introducing a raw material gas into said film-forming space through said raw material gas introduction means and supplying a high frequency power into said film-forming space through said high frequency power supply means, wherein said high frequency power supply means comprises a bar-like shaped electrode electrically connected to a very high frequency (VHF) power source, said high frequency power supplied in said film-forming space comprises a VHF power, said bar-like shaped electrode is arranged such that the longitudinal direction of said bar-like shaped electrode intersects the direction for said substrate to be moved, and the length of said film-forming space relative to the direction for said substrate to be moved is in a range of from ¹⁄₁₆ to ½ of a wavelength of said VHF power supplied in said film-forming space.

A further object of the present invention is to provide a film-forming method for forming a non-single crystalline silicon series semiconductor film on a substrate positioned in a film-forming space by introducing a raw material gas into said film-forming space and simultaneously supplying a VHF power into said film-forming space, wherein said VHF power is supplied through a bar-like shaped electrode, said bar-like shaped electrode is arranged such that the longitudinal direction of said bar-like shaped electrode intersects the direction for said substrate to be moved, and the length of said film-forming space relative to the direction for said substrate to be moved is in a range of from ¹⁄₁₆ to ½ of a wavelength of said VHF power supplied in said film-forming space.

In the present invention, the substrate is preferred to comprise a long web substrate. The bar-like shaped electrode is preferred to be arranged such that its longitudinal direction becomes substantially perpendicular to the direction for the substrate to be moved. It is also preferred for the bar-like shaped electrode to be arranged such that it is situated substantially at a center of the direction for the substrate to be moved in the film-forming space.

Further, in a preferred embodiment of the present invention, the vacuum chamber has a multi-chambered structure comprising a plurality of vacuum chambers each having a film-forming space communicated with each other, the substrate comprises a long web substrate which is continuously moved in the longitudinal direction while sequentially passing through said film-forming spaces, and a plurality of non-single crystalline silicon series semiconductor films are continuously formed on said long web substrate which is continuously moved while forming a desired non-single crystalline silicon series semiconductor film on said long web substrate by each film-forming space.

According to the present invention, a high quality large area semiconductor film having a substantially uniform film property in the thickness direction can be efficiently formed over the entire surface of a large area substrate at a high speed. Thus, the present invention is suitable particularly for the production of a solar cell.

DESCRITION OF THE INVENTION AND PREFERRED EMBODIMENTS

The present invention eliminates the foregoing disadvantages found in the prior art and attains the above described objects.

As previously described, a first aspect of the present invention is to provide a film-forming apparatus comprising at least a vacuum chamber having a film-forming space provided therein, a high frequency power supply means, and a raw material gas introduction means and in which a non-single crystalline silicon series semiconductor film is formed on a substrate positioned in said film-forming space by introducing a raw material gas into said film-forming space through said raw material gas introduction means and supplying a high frequency power into said film-forming space through said high frequency power supply means, wherein said high frequency power supply means comprises a bar-like shaped electrode electrically connected to a very high frequency (VHF) power source, said high frequency power supplied in said film-forming space comprises a VHF power, said bar-like shaped electrode is arranged such that the longitudinal direction of said bar-like shaped electrode intersects the direction for said substrate to be moved, and the length of said film-forming space relative to the direction for said substrate to be moved is in a range of from ¹⁄₁₆ to ½ of a wavelength of said VHF power supplied in said film-forming space.

A second aspect of the present invention is to provide a film-forming method for forming a non-single crystalline silicon series semiconductor film on a substrate positioned in a film-forming space by introducing a raw material gas into said film-forming space and simultaneously supplying a VHF power into said film-forming space, wherein said VHF power is supplied through a bar-like shaped electrode, said bar-like shaped electrode is arranged such that the longitudinal direction of said bar-like shaped electrode intersects the direction for said substrate to be moved, and the length of said film-forming space relative to the direction for said substrate to be moved is in a range of from $\frac{1}{16}$ to $\frac{1}{2}$ of a wavelength of said VHF power supplied in said film-forming space.

Now, in the case of a semiconductor film-forming apparatus of the type in that a functional deposited film is formed over a large area, when a VHF plasma CVD method capable of performing film deposition at a high speed is adopted, it is necessary to use a bar-like shaped electrode or a radial antenna respectively having a small surface area. However, as previously described, in the case where such electrode is used, it is difficult to attain an uniform plasma intensity distribution over a large area in comparison with the case of using a plate electrode, where a film deposited is liable to become such that is uneven with respect to the film property in the thickness direction.

However, the present invention in that such specific constitution as above described is employed enables one to desirably solve such problem. Particularly, the film-forming apparatus and the film-forming method of the present invention enable one to efficiently form a high quality large area semiconductor film having a substantially uniform film property in the thickness direction over the entire area of the film, which is suitable for the production of a large area semiconductor device such as a solar cell or the like.

In the following, the present invention will be described in more detail with reference to the drawings.

Figure 1A:
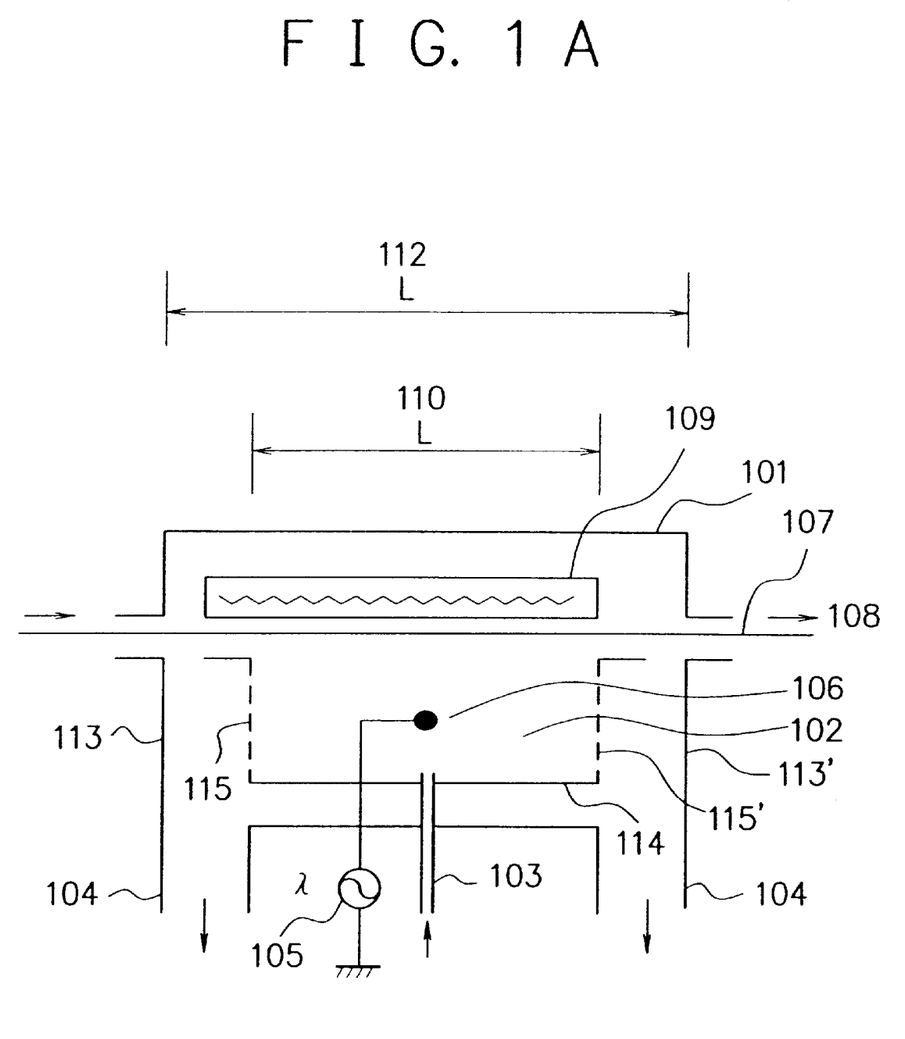
FIG. 1(A) is a schematic diagram illustrating the constitution of a principal part of an example of a film-forming apparatus according to the present invention.
Figure 1B:
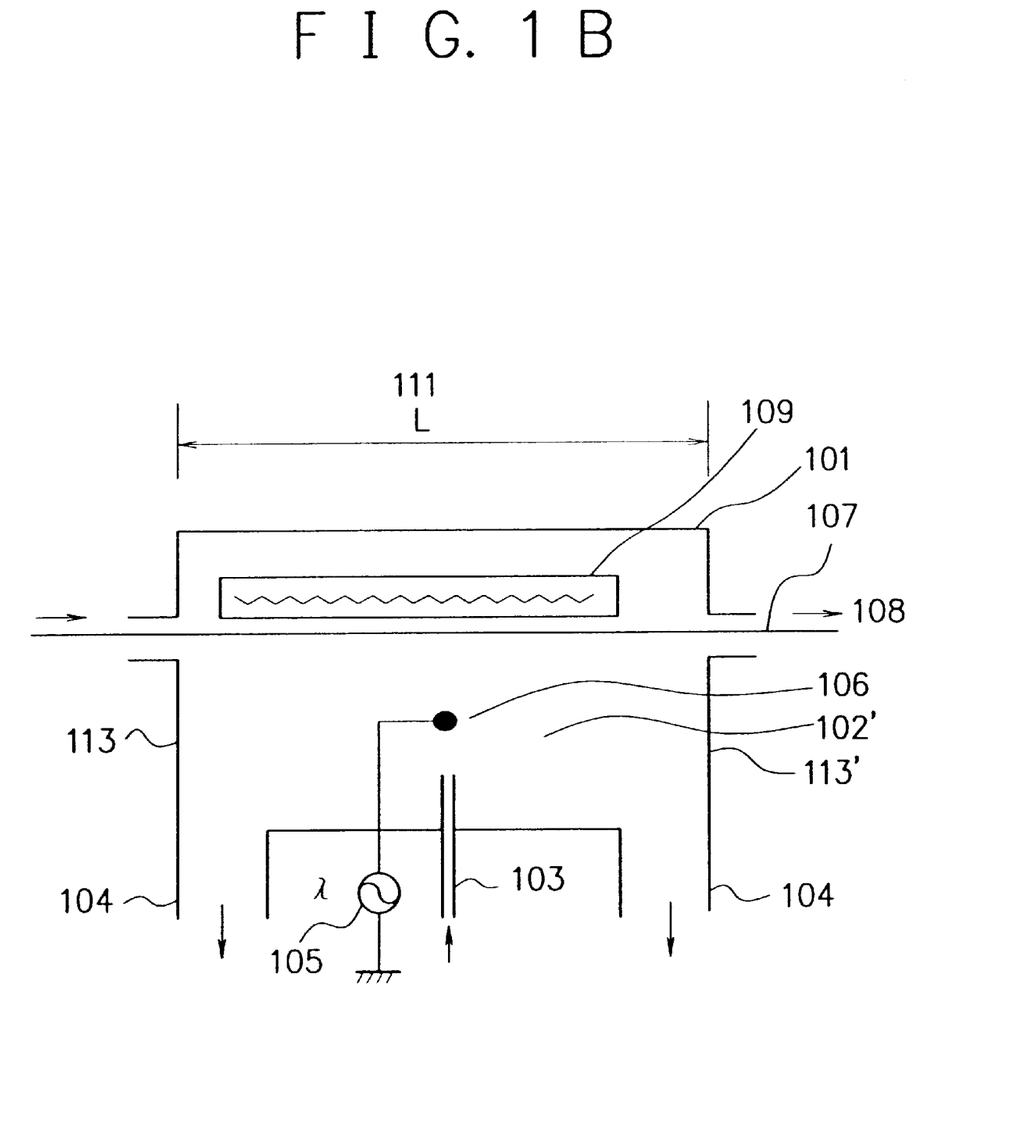
FIG. 1(B) is a schematic diagram illustrating the constitution of a principal part of another example of a film-forming apparatus according to the present invention.

FIG. 1(A) is a schematic diagram illustrating the constitution of a principal part of an example of a film-forming apparatus according to the present invention. The film-forming apparatus shown in FIG. 1(A) comprises a double-chambered system comprising a vacuum vessel (an outer chamber) and an inner chamber (having a film-forming space or a discharge space) provided in the vacuum vessel. FIG. 1(B) is a schematic diagram illustrating the constitution of a principal part of another example of a film-forming apparatus according to the present invention. The film-forming apparatus shown in FIG. 1(B) comprises a single chambered system comprising a vacuum vessel having a film-forming space (or a discharge space) provided therein.

In FIGS. 1(A) and 1(B), reference numeral 101 indicates a vacuum vessel. Reference numeral 114 [see, FIG. 1(A)] indicates an inner chamber having a film-forming space 102 (or a discharge space) provided in the vacuum chamber 101. The inner chamber 114 in this embodiment is shaped in a rectangular form and therefore, the film-forming space 102 is shaped in a rectangular form accordingly. But this is not limitative. The inner chamber may be shaped in other appropriate form. Reference numeral 102' [see, FIG. 1(B)] indicates a film-forming space (or a discharge space) provided in the vacuum chamber 101. The vacuum chamber 101 in this case is shaped in a rectangular form and therefore, the film-forming space 102 is shaped in a rectangular form accordingly. But this is not limitative. The vacuum chamber may be shaped in other appropriate form.

Each of reference numerals 113 and 113' indicates a circumferential wall of the vacuum chamber 101.

Each of reference numerals 115 and 115' [see, FIG. 1(A)] indicates a circumferential wall (or an inner wall) of the inner chamber 114. The circumferential wall (115, 115') shown in FIG. 1(A) is provided with a pluarlity of small perforations mainly for the purpose of encouraging exhaustion of gas in the film-forming space 102. However, the circumferential wall is not always necessary to be provided with such perforations.

Reference numeral 103 indicate a gas feed pipe which is open into the film-forming space 102 [see, FIG. 1(A)] or the film-forming space 102' [see, FIG. 1(B)] through one end thereof and is communicated with a raw material gas supply system (not shown). Reference numeral 104 indicates an exhaust passage which is connected to an exhaustion device (not shown). Reference number 106 indicates a bar-like shaped electrode as a high frequency power supply means provided in the film-forming space 102 [see, FIG. 1(A)] or the film-forming space 102' [see, FIG. 1(B)] and which is electrically connected to a VHF power source 105. Reference numeral 107 indicates a substrate (a web substrate) which is transported in a direction 108 (that is, in a direction from left side toward right side in the figure). Reference numeral 109 indicated a heater for heating the substrate 107.

Now, as shown in FIG. 1(A), in the vacuum vessel 101, there is provided the film-forming chamber 102 (or the inner chamber). The inner chamber 114 having the film-forming space 102 is provided the gas feed pipe 103 and the exhaust passage 104. In the film-forming space 102, there is provided the bar-like shaped electrode 106 as the high frequency power supply means which is electrically connected to the VHF power source 105. The substrate 107 serves to enclose the film-forming space 102 of the inner chamber 114. The heater 109 is provided above and along the route of the substrate 107 to be transported in the direction 108 and it serves to heat the substrate 107 to a desired temperature upon the film formation. In the film-forming space 102, a given raw material gas is introduced through the gas feed pipe 103 and at the same time, a given VHF power is supplied through the bar-like shaped electrode 106 to generated plasma discharge therein, whereby a desired semiconductor film is formed on a surface of the substrate 107 which is faced to the film-forming space 102.

Here, the bar-like shaped electrode 106 as the high frequency power supply means is arranged in the film-forming space 102 such that it is linearly extended toward an innermost portion of the figure (that is, it is extended in a direction perpendicular to the paper face of the figure) and its longitudinal direction is substantially perpendicular to the transportation direction 108 of the substrate 107. And the length 110 of the film-forming space 102 relative to the transportation direction 108 of the substrate 107 is made to fall in a range of from $\frac{1}{16}$ to $\frac{1}{2}$ of a wavelength of a VHF power supplied from the high frequency power supply means (the bar-like shaped electrode 106).

The formation of a deposited film on the substrate 107 may be conducted in an intermittently film-forming manner wherein the transportation of the substrate 107 is once suspended and a desired semiconductor film is formed on a portion of the substrate 107 which is at a standstill and is situated in the film-forming space, then the substrate is moved and stopped, followed by forming a desired semiconductor film on a successive portion of the substrate which is at a standstill and is situated in the film-forming space. It is also possible that a desired semiconductor film is continuously formed on the substrate by the film-forming space 102 while continuously transporting the substrate. Now, reference numeral 112 in FIG. 1(A) indicates a length between the opposite circumferential walls (113, 113') of the vacuum vessel.

In the film-forming apparatus according to the present invention, upon forming a deposited film (a semiconductor film on a substrate positioned in the film-forming space (or the film-forming chamber) by means of a VHF plasma CVD method, with respect to a direction perpendicular to the transportation direction of the substrate, the VHF power supply means comprising the bar-like shaped electrode is arranged such that the longitudinal direction of the VHF power supply means intersects the transportation direction of the substrate, whereby an uniform high frequency (VHF) power density is attained; and the length of the film-forming space (or the film-forming chamber) relative to the transportation direction of the substrate is made to fall in a range of from 1/16 to 1/2 of a wavelength of the VHF power supplied in the film-forming chamber, whereby enlargement of a film-forming area is attained while attaining an uniform high frequency (VHF) power density.

The film-forming space is meant a discharge space in other words. The discharge space corresponds a region where discharge (or plasma discharge) is caused in the chamber. For instance, in the case of FIG. 1(A), the discharge space (that is, the film-forming space 102) is situated inside the inner chamber 114. Thus, the distance between the opposite circumferential walls (115, 115') of the inner chamber 114 corresponds the length 110 of the film-forming chamber (or the film-forming space) relative to the transportation direction of the substrate.

Figure 3:
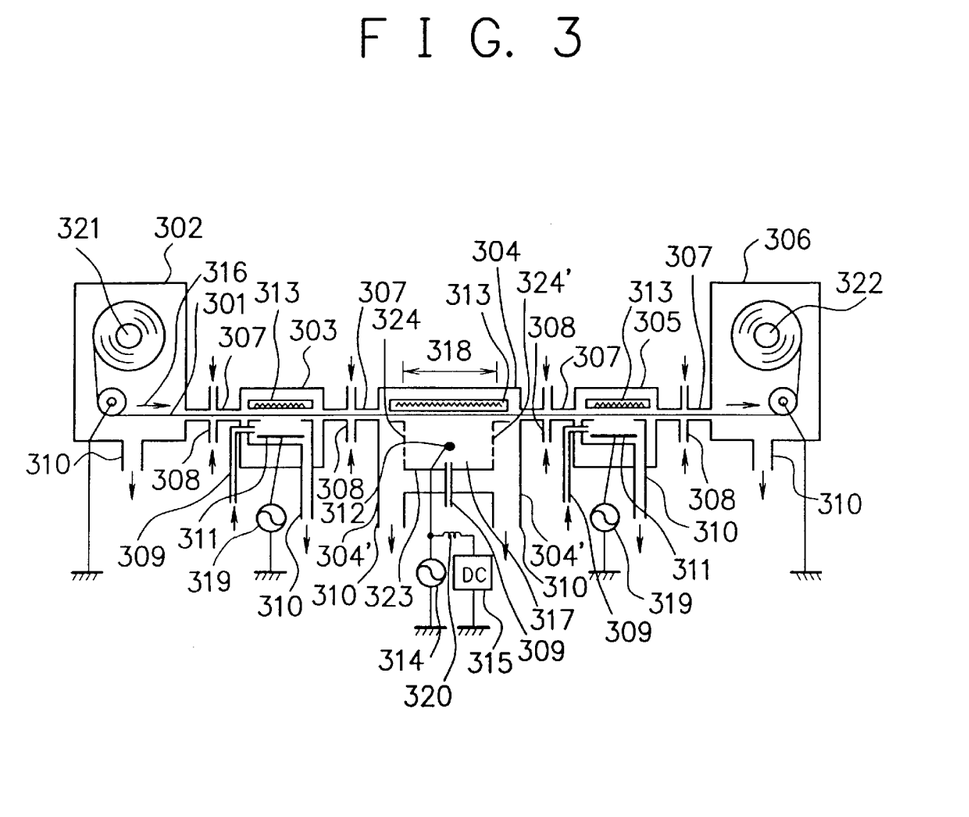
FIG. 3 is a schematic diagram illustrating the constitution of an example of a film-forming apparatus in which the present invention is applied.

Separately, in the case of a film-forming apparatus shown in FIG. 3, a film-forming space 317 which serves as a discharge space is provided in an inner chamber 323 which is provided in a vacuum vessel 304. In FIG. 3, reference numeral 301 indicates a web substrate which is transported in a direction expressed by an arrow mark 316. The length of the film-forming space relative to the transportation direction of the substrate in the film-forming apparatus shown in FIG. 3 is a length 318 corresponding the distance between the opposite circumferential walls (324, 324') of the inner chamber 323.

Further, in a single chambered comprising a vacuum vessel having a film-forming space (or a discharge space) provided therein without having an inner chamber as in the case of the film-forming apparatus shown in FIG. 1(B), the film-forming space 102' as the discharge space is situated inside the vacuum vessel 101. The length of the film-forming space relative to the transportation direction of the substrate in this case is a length 111 corresponding the distance between the opposite circumferential walls (113, 113') of the vacuum vessel 101.

Separately, in the constitution of FIG. 1(A), when the inner chamber 114 is constituted by an insulating material, the discharge space (the discharge region) is extended outside the inner chamber 114 and therefore, the such extended region is also included in the film-forming space. In this case, the distance 112 between the opposite circumferential walls (113, 113') corresponds the length of the film-forming space relative to the transportation direction of the substrate.

Now, in the case where a given VHF power is supplied in the film-forming space, when no plasma is generated therein, the inside of the film-forming is maintained in a vacuumed state, and the opposite inner wall faces of the film-forming space are in parallel to each other in a directed for the substrate to be transported, the distance between an antinode and a node of a standing wave becomes to be ¼ of a wavelength of the VHF power supplied. And when the length (110, 318) of the film-forming space relative to the transportation direction of the substrate is made to be ¼ of the wavelength of the VHF power supplied, and the bar-like shaped electrode as the high frequency power supply means is arranged in the film-forming space such that it is situated at a substantially central position of the transportation direction of the substrate while making the longitudinal direction of the bar-like shaped electrode as the high frequency power supply means to be substantially perpendicular to the transportation direction of the substrate, the distance between the bar-like shaped electrode and each of the opposite inner wall faces of the film-forming space becomes to be ¼ of the wavelength of the VHF power supplied.

In this connection, by making the length (110, 318) of the film-forming space relative to the transportation direction of the substrate to be less than ½ of the wavelength of the VHF power supplied through the bar-like shaped electrode, even when a standing wave should be occurred in the film-forming space, its antinode and node are not concurrently occurred. Thus, even when a given VHF power is supplied in the film-forming space from the bar-like shaped electrode as the high frequency power supply means, the amplitude of the standing wave is suppressed to prevent field intensity distribution from being varied.

On the other hand, in the case where the length (110, 318) of the film-forming space relative to the transportation direction of the substrate is made to be excessively small in comparison with the wavelength of the VHF power supplied, the distance between the bar-like shaped electrode and each of the opposite inner wall faces of the film-forming space is undesirably shortened and in this case, when a tiny protrusion is present on the inner wall face of the film-forming space, discharge is liable to convergently occur at such protrusion. Thus, when the length (110, 318) of the film-forming space relative to the transportation direction of the substrate is excessively small, there cannot be attained uniform discharge.

Figure 2:
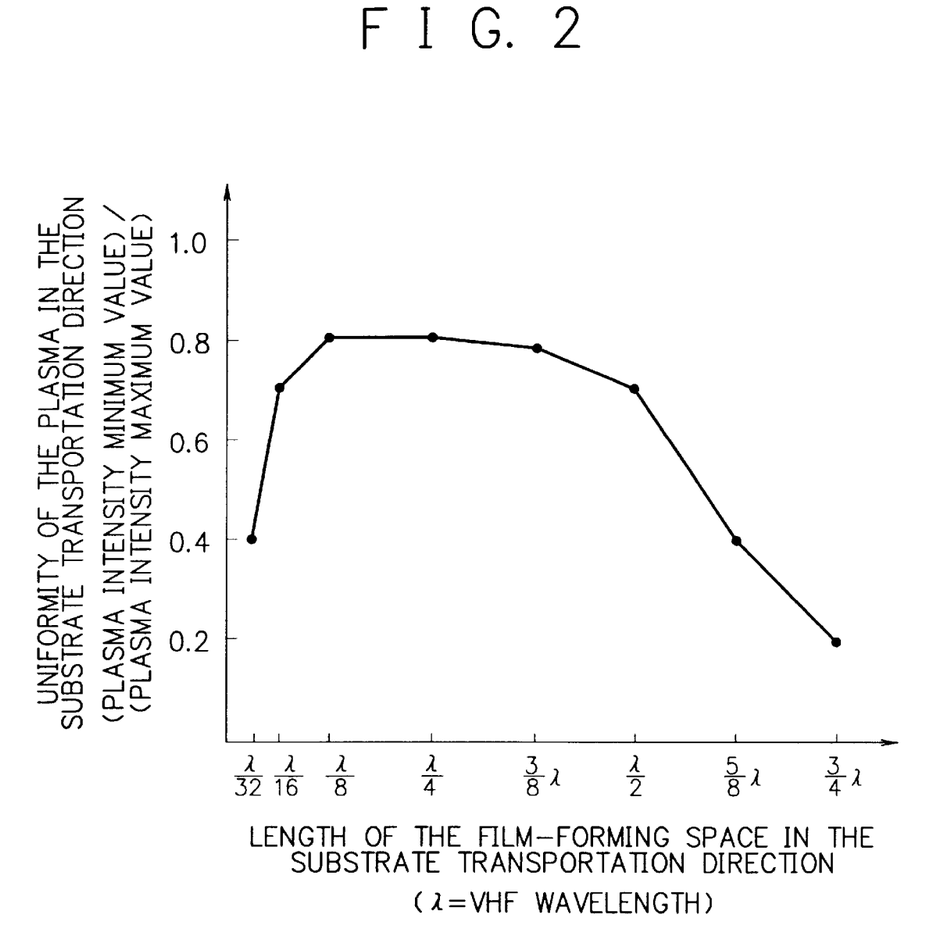
FIG. 2 is a graph of experimental results obtained by the present inventors, which will be detained later.

FIG. 2 graphically illustrates part of measured results of plasma intensity distributions in the film-forming space of the film-forming apparatus shown in FIG. 1(A) obtained by the present inventors through experiments which were conducted by using a VHF power with an oscillation frequency of 100 MHz and varying the length 110 of the film-forming space relative to the transportation direction of the substrate in a rage of from 1/32 (9.375 cm) to ¾ (225 cm) of the wavelength (300 cm) of the VHF power supplied. In FIG. 2, the abscissa indicates the length 110 of the film-forming space relative to the transportation direction of the substrate, and the ordinate indicates an index showing uniformity of a plasma intensity in the film-forming space in the direction for the substrate to be transported, where values shown are those respectively obtained by dividing the minimum value of the plasma intensity by the maximum value of the plasma intensity when the plasma intensity distribution relative to the transportation direction of the substrate was observed.

In the above, the plasma intensity was measured by the following manner. That is, the inside of the film-forming space is made to be an atmosphere composed of He gas, the VHF power is supplied to cause He plasma in the film-forming space, and the plasma intensity is measured by means of a plasma probe inserted in the film-forming space while travelling the plasma probe in the transportation direction of the substrate.

Based on the results shown in FIG. 2, there was obtained a finding that even in the case where the bar-like shaped electrode is used as the discharge electrode, when the length 110 of the film-forming space relative to the transportation direction of the substrate is made to fall in a range of from about 1/16 to about 1/2 of the wavelength of the VHF power supplied.

The above experiment procedures were repeated by changing the oscillation frequency of the VHF power to 30 MHs and 300 MHz. As a result, similar results were obtained.

As above described, the high frequency power used in the present invention is a VHF power.

The VHF is of an oscillation frequency which is higher than that of RF, i.e., 13.56 MHz or the like which is generally used in the case of using RF, and which is lower than that of a microwave, i.e., 2.45 GHz or the like. Specifically, the VHF is of an oscillation frequency roughly in a range of from 20 MHz to 500 MHz. It is preferred to selectively use a VHF with a relatively large oscillation frequency which falls in this range in the case where it is intended to heighten the plasma density and to improve the film deposition rate. In the case where it is intended to attain uniformity of the plasma over a large area, it is preferred to selectively use a VHF with a relatively small oscillation frequency which falls in the above range, which has a relatively long wavelength and excels in uniformity for a large area.

The high frequency power supply means used in the above comprises a bar-like shaped electrode. The bar-like shaped electrode differs from a plate electrode which is generally used as the RF discharge electrode, and it is meant an electrode shaped in a bar-like form whose surface area is small.

The bar-like shaped electrode may have a cross section in a circular form or a rectangular form, or it may has a cross section in which the thickness is varied. And the configuration thereof in the longitudinal direction may be in a linear form, a crank form or a curved form. In any case, the bar-like shaped electrode is arranged such that its longitudinal direction intersects the transportation direction of the substrate, preferably at right angles.

The length of the bar-like shaped electrode is preferably 1/2 or less, or more preferably 1/4 or less of a wavelength of an VHF power supplied through the bar-like shaped electrode, with respect to a perpendicular direction to the transportation direction of the substrate.

The position for the bar-like shaped electrode arranged in the film-forming space should be determined so that plasma is generated in a more uniform state in the transportation direction of the substrate. Particularly, when the VHF power is supplied from one position, it is desired for the bar-like shaped electrode to be arranged in the vicinity of the center of the film-forming space in the transportation direction of the substrate. For the height of the bar-like shaped electrode at said position in the film-forming space, the bar-like shaped electrode is not arranged so as to situate in proximity to the inner wall face of the film-forming space in a manner of generally adopting in the case where an RF plate electrode is arranged but it is desired to be arranged in a floated state having a prescribed interval from either inner wall face of the film-forming space.

The bar-like shaped electrode is constituted by a material which retains its shape without being melted or curved and which retains its electrical conductivity even when high density plasma is formed by introducing a high discharging power. As such material, there are mentioned metallic materials which satisfy these requirements. Specific examples of such metallic material are stainless steels, nickel, and the like. Besides, carbon rods are also usable.

As the raw material gas used for the formation of a non-single crystalline silicon series semiconductor film in the present invention, there can be mentioned, for example, Si-containing compounds capable of imparting silicon (Si) atoms and which are in the gaseous state at room temperature or can be easily gasified, representatively such as chain silane compounds, cyclic silane compounds, and the like. Specific examples of such compound are $SiH_4$, $Si_2H_6$, $SiF_4$, $SiFH_2$, $SiF_2H_2$, $SiF_3H$, $Si_2H_8$, $SiD_4$, $SiHD_3$, $SiH_2D_2$, $SiH_3D$, $SiFD_3$, $SiF_2D_2$, $Si_2D_3H_3$, $(SiF_2)_5$, $(SiF_2)_6$, $(SiF_2)_4$, $Si_2F_6$, $Si_3F_5$, $Si_2H_2F_4$, $Si_2H_3F_3$, $SiCl_4$, $(SiCl_2)_5$, $SiBr_4$, $Si_2Cl_6$, $SiHCl_3$, $SiH_2Br_2$, $SiH_2Cl_2$, and $SiCl_3F_5$ which are in the gaseous state at room temperature or can be easily gasified. The term "D" in these compounds indicates deuterium.

Similarly as the raw material gas used for the formation of a non-single crystalline silicon-germanium semiconductor film in the present invention, an appropriate Ge-containing compound capable of imparting germanium (Ge) atoms and which is in the gaseous state at room temperature or can be easily gasified is used in addition to any of the above-mentioned Si-containing compounds. Specific examples of such Ge-containing compound are $GeH_4$, $GeD_4$, $GeF_4$, $GeFH_3$, $GeF_2H_2$, $GeF_3H$, $GeHD_3$, $GeH_2D_2$, $GeH_3D$, $Ge_2H_6$, $Ge_2D_6$, and the like which are in the gaseous state at room temperature or can be easily gasified.

As the raw material gas used for the formation of a non-single crystalline silicon carbide semiconductor film in the present invention, an appropriate C-containing compound capable of imparting carbon (C) atoms and which is in the gaseous state at room temperature or can be easily gasified is used in addition to any of the above-mentioned Si-containing compounds. Specific examples of such C-containing compound are $CH_4$, $CD_4$, $C_nH_{2n+2}$ (with n being an integer), $C_nH_{2n}$ (with n being an integer), $C_2H_2$, $C_6H_6$, $CO_2$, $CO$, and the like which are in the gaseous state at room temperature or can be easily gasified.

In the present invention, any of the non-single crystalline silicon series semiconductor films formed may be made to have a conduction type of either p-type or n-type by incorporating an appropriate valence electron-controlling agent therein upon the formation thereof. Such valence electron-controlling agent includes group III elements and group V elements of the periodic table. In order to incorporate such group III or V element as the valence electron-controlling agent, there is used an appropriate compound capable of supplying a group III or V element which is in the gaseous state at room temperature or can be easily gasified.

Specific examples of such group III element-supplying gaseous or easily gasifiable compound are boron hydrides such as $B_2H_6$, and the like, and boron halides such as $BF_3$, $BCl_3$, and the like, which are capable supplying B upon the film formation. Similarly, specific examples of such group V element-supplying gaseous or easily gasifiable compound are phosphorous hydrides such as $PH_3$, and the like, and phosphorous halides such as $PF_3$, and the like, which are capable of supplying P upon the film formation. Besides, other compounds such as $AsH_3$, and the like are also usable.

Any of the foregoing gaseous raw materials used for the formation of a given semiconductor film may be diluted with an appropriate dilution gas such as $H_2$ gas, Ne gas, Ar gas, Xe gas or Kr gas prior to the introduction thereof into the film-forming space.

The substrate on which a desired semiconductor film is formed in the film-forming space while moving the substrate is desired to be constituted by a material which is scarcely deformed or distorted at a temperature required upon the film formation, has a desired strength, and is electrically conductive. Such material can include metal thin plates made of aluminum, iron or stainless steel, and films made of heat-resistant resin such as polyimide or fluororesin (Teflon) and which are applied with electroconductive treatment to their surface.

In the following, the present invention will be described in more detail with reference to examples. It should be understood that these examples are only for illustrative purposes and are not intended to restrict the scope of the present invention.

EXAMPLE 1A

In this example, using a film-forming apparatus of the constitution shown in FIG. 3, there was prepared a solar cell having a three-layered structure with a n-i-p junction comprising a non-single crystalline silicon series material.

FIG. 3 a schematic diagram illustrating the constitution of an example of a film-forming apparatus in which the film-forming apparatus shown in FIG. 1(A) of the present invention is adopted.

In the apparatus shown in FIG. 3, a three-layered semiconductor film comprising a non-single crystalline silicon series material for a solar cell for example can be continuously formed on a web substrate while continuously moving to sequentially pass through three chambers. The film formation in this case may be conducted in an intermittently film-forming manner wherein the transportation of the substrate is once suspended when the substrate arrives in a given chamber and a desired semiconductor film is formed on a portion of the substrate which is at a standstill, then the substrate is moved and stopped when the substrate arrives in a next chamber, followed by forming another semiconductor film on a successive portion of the substrate which is at a standstill.

Now, in FIG. 3, reference numeral 321 indicates a pay-out bobbin having a long web substrate 301 wound thereon in a coil form, which is installed in a substrate delivery chamber 302. The web substrate 301 is paid out from the pay-out bobbin 321, and it is delivered through a steering roll, followed by being transported to sequentially pass through vacuum chambers 303, 304, and 305, and enters in a substrate take-up chamber 306 where it is taken up by and wound on a take-up bobbin 322 in a coil form provided in the substrate take-up chamber 306. The delivery chamber 302, the vacuum chambers 303–305, and the take-up chamber 306 are communicated with each other by means of respective gas gates 307. Each gas gate 307 which allows the web substrate 301 to pass therethrough is provided with a gate gas introduction pipe 308 at a position in the vicinity of the central portion in a direction for the web substrate 301 to be transported. Each gate gas introduction pipe 308 is extending from a separation gas supply system (not shown). Separation gas such as H$_2$ gas or He gas is introduced into each gas gate 307 through the corresponding gate gas introduction pipe 308, where gas flow is formed so to flow from the center of the gas gate 307 toward either sides of the adjacent chambers. This situation prevents the raw material gases used in the adjacent chambers from being contaminated with each other. Thus, the raw material gases used in the adjacent chambers are isolated one from the other.

In each of the vacuum chambers 303 and 305, film formation on the web substrate 301 is conducted by an RF plasma CVD method using an RF power with an oscillation frequency of 13.56 MHz. Each of the vacuum chambers 303 and 305 is provided with a film-forming space and a heater 313 provided above the film forming space, wherein the film-forming space is provide with a discharge electrode 311 (in a plate form) therein which is electrically connected to an RF power source 319 and it is also provided with a gas feed pipe 309 extending from a raw material gas supply system (not shown) and an exhaust pipe 310 which is connected to an exhaustion device (not shown). In the film-forming space in each of the vacuum chambers 303 and 305, an RF power with an oscillation frequency of 13.56 MHz is supplied through the discharge electrode 311.

The vacuum chamber 304 has the same constitution as that shown in FIG. 1(A). In the vacuum chamber 304, film formation on the web substrate 301 is conducted by a VHF plasma CVD method using a VHF power with an oscillation frequency of 100 MHz, in the same manner as in the case of FIG. 1(A). In the vacuum chamber 304, there is provided an inner chamber 323 provided having a film-forming space 317 therein. Reference numeral 304' indicates a circumferential wall of the vacuum chamber 304, and each of reference numerals 324 and 324' a circumferential wall of the inner chamber 323. Reference numeral 312 indicates a bar-like shaped electrode provided in the film-forming space 317. To the bar-like shaped electrode 312, a VHF power source 314 is electrically connected and a D.C. power source 315 is also electrically connected through a choke coil 320. Thus, in the film-forming space 317, it is possible that a VHF power with an oscillation frequency of 100 MHz is supplied through the bar-like shaped electrode 312, and at the same time, a given D.C. voltage as a bias voltage is supplied also through the bar-like shaped electrode 312.

The inner chamber 323 is provided with a gas feed pipe 309 extending from a raw material gas supply system (not shown) and an exhaust pipe 310 (or an exhaust passage) connected to an exhaustion device (not shown). Reference numeral 313 indicates a heater for heating the web substrate 301, which is provided above the film-forming space 317.

The bar-like shaped electrode 312 is shaped in a long round bar form which is extended in a width direction of the web substrate 301. And the bar-like shaped electrode 312 is arranged such that its longitudinal direction intersects the transportation direction 316 of the web substrate 301.

Further, in the vacuum chamber 304, the length 318 of the film-forming space 317 relative to the transportation direction 316 of the web substrate 301 is made to fall in a range of from 1/16 to 1/2 of a wavelength of the oscillation frequency of the VHF power source 314. In this example, the length 318 of the film-forming space 317 relative to the transportation direction 316 of the web substrate 301 was made to be 1/4 (75 cm) of said wavelength.

Film formation using the apparatus shown in FIG. 3 was conducted as follows.

There was provided a pay-out bobbin 321 having a stainless steel web substrate (SUS430-BA) having a length of 500 m, a width of 356 mm and a thickness of 0.15 mm as the web substrate 301 wound thereon in a coil form. This pay-out bobbin 321 was set in the delivery chamber 302. The web substrate 301 was paid out from the pay-out bobbin 321, and it was delivered from the delivery chamber 302, followed by passing through the first gas gate 307, the vacuum chambers 303, the second gas gate 307, the vacuum chamber 304, the third gas gate 307, the vacuum chamber 305, and the fourth gas gate 307 to enter in the substrate take-up chamber 306 where the beginning portion of the web substrate 301 was fixed to and wound on the take-up bobbin 322. And the transportation system was adjusted so that the web substrate 301 could be continuously and smoothly transported from the substrate delivery chamber 302 to the substrate take-up chamber while being tensioned without being distorted or warped using a tension applying mechanism (not shown). Then, the inside of each of the chambers 302–306 was evacuated to a vacuum of less than 1 Pa by means of the exhaustion means (including the exhaust pipe 310). While continuing the evacuation for each chamber, He gas was introduced into each of the vacuum chambers 303–305 at a flow rate of 100 sccm through the gas feed pipe 309, and the inner pressure of each of the vacuum chambers 303–305 was maintained at 100 Pa by regulating the opening of an exhaust valve (not shown) provided in the exhaustion means.

While maintaining this state, by actuating a substrate-conveying mechanism provided at the take-up bobbin 322, the web substrate 301 was started transporting at a transportation speed of 1200 mm/minute. Then, the substrate web 301 moving in each of the vacuum chambers 303–305 was heated to have a prescribed substrate temperature using the corresponding heater 313 and a corresponding substrate temperature monitor (not shown). When the web substrate 310 became so that it was uniformly heated to have a prescribed substrate temperature in each of the vacuum chambers 303–305, while continuing the heating of the web substrate 301, the introduction of the He gas was terminated, followed by introducing raw material gas including $SiH_4$ into the film-forming space of each of the vacuum chambers 303–305 through the corresponding gas feed pipe 309. In this case, $H_2$ gas as the separation gas was flown into each of the gas gates 307 at a flow rate of 1000 sccm through the corresponding gate gas introduction pipe 308.

Then, in each of the vacuum chambers 303 and 305, an RF power with an oscillation frequency of 13.56 MHz was supplied into the film-forming space therein through the plate electrode 311 to case plasma discharge whereby the raw material gas therein was decomposed, and in the vacuum chamber 304, a VHF power with an oscillation frequency of 100 MHz was supplied into the film-forming space 317 through the bar-like shaped electrode 312, in addition, a D.C. voltage of 100 V was applied to the bar-like shaped electrode 312 in a formed direction to the web substrate 301 having an earth potential, whereby plasma discharge was caused to decompose the raw material gas therein. By this, on the web substrate 301 which was moving, there were sequentially formed an n-type amorphous silicon (a-Si) semiconductor film in the vacuum chamber 303, an i-type amorphous silicon-germanium (a-SiGe) semiconductor film in the vacuum chamber 304, and a p-type microcrystalline silicon ($\mu$c-Si) semiconductor film in the vacuum chamber 305. In this way, a semiconductor film having a three-layered structure with a n-i-p junction for a solar cell was continuously formed on the long web substrate 301.

Details of the film-forming conditions in the respective vacuum chambers 303–305 in the above are collectively shown in Table 1.

In the above, the length 318 of the film-forming space 317 in the vacuum chamber 304 relative to the transportation direction 316 of the web substrate was made to be ¼ (75 cm, see Table 1) of the wavelength of the VHF power supplied. In this connection, it is considered that an antinode and a node of the VHF were not concurrently present in the film-forming space 317. Thus, it is considered that the plasma was generated in a substantially uniform state in the film-forming space 317.

Now, the above formation of the semiconductor film having a three-layered structure with a n-i-p junction on the web substrate 301 was continuously conducted over the length of 400 m of the web substrate 301. Thereafter, the supply of the discharging power and the introduction of the raw material in each of the vacuum chambers 303–305 were terminated, the heaters in the respective vacuum chambers were switched off, and the inside of each of the chambers was sufficiently purged. Then, the web substrate and the inside of the apparatus were sufficiently cooled. Thereafter, the inside of the substrate was returned to atmospheric pressure, and the take-up bobbin 322 having the web substrate with the three-layered semiconductor film wound thereon in a coil form (this will be hereinafter referred to as "web substrate roll") was taken out from the substrate take-up chamber 306.

The web substrate roll thus taken out was set in a conventional roll-to-roll type film-forming apparatus by way of sputtering (not shown), where a 60 nm thick ITO film as a transparent electrode was continuously formed on the three-layered semiconductor film formed on the long web substrate. The resultant was cut to obtain a plurality of rectangular elements each having a width of 35 cm and a length of 5 cm (in the substrate transportation direction). Then, on the transparent electrode of each of the resultant elements, there was formed a collecting electrode by forming a plurality of Ag thin electrodes at a prescribed interval in accordance with a conventional manner. By this, there were obtained a plurality of rectangular solar cells having an n-i-P junction structure. For each of the resultant solar cells, evaluation was conducted with respect to its I-V characteristics under irradiation of pseudo sunlight of AM 1.5 (100 mW/cm$^2$). And based on the I-V characteristics, a photoelectric conversion efficiency was obtained for each of the solar cells. And there was calculated an average value as an average photoelectric conversion efficiency among the photoelectric conversion efficiencies of the solar cells involved.

EXAMPLE 1B

The procedure of Example 1A were repeated, except that the film formation in each of the vacuum chambers was conducted without moving the web substrate, to obtain a number of solar cells. It is considered that an antinode and a node of the VHF were not concurrently present in the film-forming space 317 also in this example.

For the resultant solar cells, evaluation was conducted with respect to their characteristics in the same manner as in Example 1A. And there was measured an average photoelectric conversion efficiency for the solar cells involved.

The average photoelectric conversion efficiency in this example was compared with the average photoelectric conversion efficiency in Example 1A by setting the latter at 1. As a result, the average photoelectric conversion efficiency in this example was found to be 1.0 time that in Example 1A.

This result reveals that this example enables one to efficiently mass-produce solar cells having a sufficient average photoelectric conversion efficiency (that is, satisfactory solar cell characteristics) which is similar to that of the solar cells prepared by way of conducting the film formation on the web substrate while continuously moving said web substrate in Example 1A.

Incidentally, in Example 1A, there was adopted the manner of forming a semiconductor film on the web substrate which was continuously moving, and because of this, the productivity in Example 1A was higher than that in this example.

COMPARATIVE EXAMPLE 1A

The procedures of Example 1A were repeated, except that the length 318 of the film-forming space 317 relative to the transportation direction of the web substrate was made to be ⅗ (180 cm) of the wavelength of the VHF power supplied which is longer than ½ of said wavelength and the flow rates of the raw material gases and the VHF power in the film-forming space 317 were adjusted so that the thickness of the i-type semiconductor layer formed by the film-forming space 317 became the same as that in Example 1A, to obtain a plurality of solar cells having an n-i-P junction structure.

The resultant solar cells were evaluated in the same manner as in Example 1A to obtain an average photoelectric conversion efficiency for them.

The average photoelectric conversion efficiency in this comparative example was compared with the average photoelectric conversion efficiency in Example 1A by setting the latter at 1. As a result, the average photoelectric conversion efficiency in this comparative example was found to be 0.65 time that in Example 1A.

This result reveals that the average photoelectric conversion efficiency of the solar cells in this comparative example is inferior to that of the solar cells in Example 1A.

In this comparative example, the length 318 of the film-forming space 317 relative to the transportation direction of the web substrate was made to be ⅗ (180 cm) of the wavelength of the VHF power supplied which is longer than ½ of said wavelength as above described. Thus, it is considered that an antinode and a node of the VHF were concurrently present in the film-forming space 317 and because of this, unevenness was occurred in the plasma intensity distribution in the film-forming space 317. In this connection, it is considered that during when the web substrate was continuously moving in the film-forming space 317, an i-type semiconductor film was formed on the web substrate with good plasma having good properties and at the same time, another i-type semiconductor film was formed on the web substrate with inferior plasma having inferior properties. For the semiconductor film formed with VHF plasma having uneven in its intensity distribution in this way, it is considered that the film has unevenness with respect to the film property in the thickness direction.

Consequently, the reason why the average photoelectric conversion efficiency of the solar cells in this comparative example is inferior to that of the solar cells in Example 1A is considered to be owing to the factor that the i-type semiconductor film formed in the film-forming space 317 has unevenness with respect to the film property in the thickness direction.

COMPARATIVE EXAMPLE 1B

The procedures of Example 1B were repeated, except that the length 318 of the film-forming space 317 relative to the transportation direction of the web substrate was made to be ⅗ (180 cm) of the wavelength of the VHF power supplied which is longer than ½ of said wavelength and the flow rates of the raw material gases and the VHF power in the film-forming space 317 were adjusted so that the thickness of the i-type semiconductor layer formed by the film-forming space 317 became the same as that in Example 1A, to obtain a plurality of solar cells having an n-i-P junction structure.

Particularly, because the length 318 of the film-forming space 317 relative to the transportation direction of the web substrate was made to be longer than ½ of the wavelength of the VHF power supplied as above described, an antinode and a node of the VHF were concurrently present in the film-forming space 317 and because of this, unevenness was occasionally occurred in the plasma intensity distribution in the film-forming space 317, where a i-type semiconductor film having an uniform film property could not be formed on the web substrate. Thus, of the web substrate having the three-layered semiconductor film formed thereon, using part of the web substrate having the three-layered semiconductor film whose i-type semiconductor film was formed with the good plasma having good properties (the plasma at the central portion in the transportation direction of the web substrate), there were prepared a plurality of solar cells having an n-i-P junction structure (these solar cells will be hereinafter referred to as "solar cell group 1"). And using the remaining part of the web substrate, there were prepared a plurality of solar cells having an n-i-P junction structure (these solar cells will be hereinafter referred to as "solar cell group 2"). The solar cells of each of the solar cell groups 1 and 2 were evaluated in the same manner as in Example 1A to obtain an average photoelectric conversion efficiency for the solar cells of the solar cell group 1 and an average photoelectric conversion efficiency for the solar cells of the solar cell group 2.

Each of the average photoelectric conversion efficiency of the solar cell group 1 and the average photoelectric conversion efficiency of the solar cell group 2 was compared with the average photoelectric conversion efficiency in Example 1B by setting the average photoelectric conversion efficiency in Example 1B at 1. As a result, the average photoelectric conversion efficiency of the solar cell group 1 was found to be substantially the same as that in Example 1B. And the average photoelectric conversion efficiency of the solar cell group 2 was found to be 0.65 time that in Example 1B.

These results reveal that the average photoelectric conversion efficiency of the solar cells of the solar cell group 2 is apparently inferior to that of the solar cells in Example 1A.

For the reason why the average photoelectric conversion efficiency of the solar cell group 1 is substantially the same as that in Example 1B, it is considered such that the i-type semiconductor films of the solar cells of the solar cell group 1 are substantially the same as those of the solar cells in Example 1B with respect to their film properties in the thickness direction. For the reason why the average photoelectric conversion efficiency of the solar cell group 2 is inferior to that in Example 1B, it is considered such that the i-type semiconductor films of the solar cells of the solar cell group 2 are homogeneous with respect to their film properties in the thickness direction.

Thus, in this comparative example, although a semiconductor film having an uniform property in the thickness direction can be formed on part of the web substrate, because plasma generated in the film-forming space 317 has unevenness with respect to the plasma intensity distribution, a semiconductor film having a homogeneous film property cannot be desirable formed over the entirety of the web substrate. On the other hand, in Example 1B, a semiconductor film having a homogeneous film property could be desirable formed over the entirety of the web substrate.

COMPARATIVE EXAMPLE 2A

The procedures of Example 1A were repeated, except that the length 318 of the film-forming space 317 relative to the transportation direction of the web substrate was made to be 1/32 (9.375 cm) of the wavelength of the VHF power supplied which is shorter than 1/6 of said wavelength and the flow rates of the raw material gases and the VHF power in the film-forming space 317 were adjusted so that the thickness of the i-type semiconductor layer formed by the film-forming space 317 became the same as that in Example 1A, to obtain a plurality of solar cells having an n-i-P junction structure.

The resultant solar cells were evaluated in the same manner as in Example 1A to obtain an average photoelectric conversion efficiency for them.

The average photoelectric conversion efficiency in this comparative example was compared with the average photoelectric conversion efficiency in Example 1A by setting the latter at 1. As a result, the average photoelectric conversion efficiency in this comparative example was found to be 0.7 time that in Example 1A.

This result reveals that the average photoelectric conversion efficiency of the solar cells in this comparative example is apparently inferior to that of the solar cells in Example 1A.

For the reason for this, it is considered such that because the length 318 of the film-forming space 317 relative to the transportation direction of the web substrate is 1/32 of the wavelength of the VHF power supplied which is quite short, the distance between the bar-like shaped electrode 312 and each of the opposite inner wall faces of the film-forming space 317 is short and because of this, when a tiny protrusion is present on the inner wall face, discharge is liable to convergently occur at such protrusion, where the discharge becomes uneven.

COMPARATIVE EXAMPLE 2B

The procedures of Example 1B were repeated, except that the length 318 of the film-forming space 317 relative to the transportation direction of the web substrate was made to be 1/32 (9.375 cm) of the wavelength of the VHF power supplied which is shorter than 1/6 of said wavelength and the flow rates of the raw material gases and the VHF power in the film-forming space 317 were adjusted so that the thickness of the i-type semiconductor layer formed by the film-forming space 317 became the same as that in Example 1B, to obtain a plurality of solar cells having an n-i-P junction structure.

The resultant solar cells were evaluated in the same manner as in Example 1A to obtain an average photoelectric conversion efficiency for them.

The average photoelectric conversion efficiency in this comparative example was compared with the average photoelectric conversion efficiency in Example 1B by setting the latter at 1. As a result, the average photoelectric conversion efficiency in this comparative example was found to be 0.7 time that in Example 1B.

This result reveals that the average photoelectric conversion efficiency of the solar cells in this comparative example is apparently inferior to that of the solar cells in Example 1B.

The reason for this is considered to be owing to the same factor described in Comparative Example 2A.

EXAMPLE 2

The procedures of Example 1A were repeated, except that the length 318 of the film-forming space 317 relative to the transportation direction of the web substrate was made to be 1/16 (18.75 cm) of the wavelength of the VHF power supplied and the flow rates of the raw material gases and the VHF power in the film-forming space 317 were adjusted so that the thickness of the i-type semiconductor layer formed by the film-forming space 317 became the same as that in Example 1A, to obtain a plurality of solar cells having an n-i-P junction structure.

The resultant solar cells were evaluated in the same manner as in Example 1A to obtain an average photoelectric conversion efficiency for them.

The average photoelectric conversion efficiency in this example was compared with the average photoelectric conversion efficiency in Example 1A by setting the latter at 1. As a result, the average photoelectric conversion efficiency in this example was found to be 0.9 time that in Example 1A.

This result reveals that the average photoelectric conversion efficiency of the solar cells in this example is somewhat inferior to that of the solar cells in Example 1A. However, the average photoelectric conversion efficiency of the solar cells in this comparative example is satisfactory. Thus, it is understood that this example enables one to efficiently mass-produce solar cells having satisfactory solar cell characteristics.

EXAMPLE 3

The procedures of Example 1A were repeated, except that the length 318 of the film-forming space 317 relative to the transportation direction of the web substrate was made to be 1/2 (150 cm) of the wavelength of the VHF power supplied and the flow rates of the raw material gases and the VHF power in the film-forming space 317 were adjusted so that the thickness of the i-type semiconductor layer formed by the film-forming space 317 became the same as that in Example 1A, to obtain a plurality of solar cells having an n-i-P junction structure.

The resultant solar cells were evaluated in the same manner as in Example 1A to obtain an average photoelectric conversion efficiency for them.

The average photoelectric conversion efficiency in this example was compared with the average photoelectric conversion efficiency in Example 1A by setting the latter at 1. As a result, the average photoelectric conversion efficiency in this example was found to be 0.9 time that in Example 1A.

This result reveals that the average photoelectric conversion efficiency of the solar cells in this example is somewhat inferior to that of the solar cells in Example 1A. However, the average photoelectric conversion efficiency of the solar cells in this comparative example is satisfactory. Thus, it is understood that this example enables one to efficiently mass-produce solar cells having satisfactory solar cell characteristics.

EXAMPLE 4A AND EXAMPLE 4B

Example 4A

The procedures of Example 1A were repeated, except that the discharging frequency (the oscillation frequency of the VHF power) was changed to 50 MHz; the length 318 of the film-forming space 317 relative to the transportation direction of the web substrate was made to be 1/4 (150 cm) of the wavelength of the VHF power supplied; and the flow rates of the raw material gases and the VHF power in the film-forming space 317 were adjusted so that the thickness of the i-type semiconductor layer formed by the film-forming space 317 became the same as that in Example 1A, to obtain a plurality of solar cells having an n-i-P junction structure.

Example 4B

The procedures of Example 4A were repeated, except that the formation of the i-type semiconductor film on the web substrate in the film-forming space 317 was conducted by suspending the transportation of the web substrate when a portion of the web substrate on which the i-type semiconductor film is to be formed arrived in the film-forming space 317, to obtain a plurality of solar cells having an n-i-P junction structure.

EVALUATION

The solar cells obtained in Example 4A were evaluated in the same manner as in Example 1A to obtain an average photoelectric conversion efficiency for them. Similarly, the solar cells obtained in Example 4B were evaluated in the same manner as in Example 1A to obtain an average photoelectric conversion efficiency for them.

The average photoelectric conversion efficiency in Example 4A was compared with the average photoelectric conversion efficiency in Example 4B by setting the latter at 1. As a result, the average photoelectric conversion efficiency in Example 4A was found to be 0.95 time that in Example 4B.

This result reveals that the average photoelectric conversion efficiency in Example 4A in which the film formation was conducted while continuously moving the web substrate is almost the same as that in Example 4B in which the film formation was conducted while suspending the transportation of the web substrate. Thus, it is understood that the film formation while continuously moving the web substrate does not invite a substantial reduction in the average photoelectric conversion efficiency for the resulting solar cells.

And the productivity in Example 4A was higher than that in Example 4B because there was adopted the method of continuously forming a semiconductor film on the web substrate which is continuously moving in Example 4A.

EXAMPLE 5A AND EXAMPLE 5B

Example 5A

The procedures of Example 1A were repeated, except that the discharging frequency (the oscillation frequency of the VHF power) was changed to 300 MHz; the length 318 of the film-forming space 317 relative to the transportation direction of the web substrate was made to be ¼ (25 cm) of the wavelength of the VHF power supplied; and the flow rates of the raw material gases and the VHF power in the film-forming space 317 were adjusted so that the thickness of the i-type semiconductor layer formed by the film-forming space 317 became the same as that in Example 1A, to obtain a plurality of solar cells having an n-i-P junction structure.

Example 5B

The procedures of Example 5A were repeated, except that the formation of the i-type semiconductor film on the web substrate in the film-forming space 317 was conducted by suspending the transportation of the web substrate when a portion of the web substrate on which the i-type semiconductor film is to be formed arrived in the film-forming space 317, to obtain a plurality of solar cells having an n-i-P junction structure.

EVALUATION

The solar cells obtained in Example 5A were evaluated in the same manner as in Example 1A to obtain an average photoelectric conversion efficiency for them. Similarly, the solar cells obtained in Example 5B were evaluated in the same manner as in Example 1A to obtain an average photoelectric conversion efficiency for them.

The average photoelectric conversion efficiency in Example 5A was compared with the average photoelectric conversion efficiency in Example 5B by setting the latter at 1. As a result, the average photoelectric conversion efficiency in Example 5A was found to be 1.0 time that in Example 5B.

This result reveals that the average photoelectric conversion efficiency in Example 5A in which the film formation was conducted while continuously moving the web substrate is substantially the same as that in Example 5B in which the film formation was conducted while suspending the transportation of the web substrate. Thus, it is understood that the film formation while continuously moving the web substrate does not invite a substantial reduction in the average photoelectric conversion efficiency for the resulting solar cells.

And the productivity in Example 5A was higher than that in Example 5B because there was adopted the method of continuously forming a semiconductor film on the web substrate which is continuously moving in Example 5A.

EXAMPLE 6A AND EXAMPLE 6B

Example 6A

The procedures of Example 1A were repeated, except that a i-type amorphous silicon (a-Si) semiconductor film was formed on the web substrate in the film-forming space 317, to obtain a plurality of solar cells having an n-i-P junction structure.

The film-forming conditions in the respective vacuum chambers 303–305 in this example are shown in Table 2. Incidentally, in this example, on the web substrate which was continuously moving, there were sequentially formed an n-type amorphous silicon (a-Si) semiconductor film in the vacuum chamber 303, an i-type amorphous silicon (a-Si) semiconductor film in the vacuum chamber 304, and a p-type microcrystalline silicon ($\mu$c-Si) semiconductor film in the vacuum chamber 305.

In this example, the length 318 of the film-forming space 317 relative to the transportation direction of the web substrate was made to be ¼ of the wavelength of the VHF power supplied as well as in the case of Example 1A. In this connection, it is considered that an antinode and a node of the VHF were not concurrently present in the film-forming space 317 and that the plasma was generated in a substantially uniform state in the film-forming space 317.

Example 6B

The procedures of Example 6A were repeated, except that the formation of the i-type semiconductor film on the web substrate in the film-forming space 317 was conducted by suspending the transportation of the web substrate when a portion of the web substrate on which the i-type semiconductor film is to be formed arrived in the film-forming space 317, to obtain a plurality of solar cells having an n-i-P junction structure.

EVALUATION

The solar cells obtained in Example 6A were evaluated in the same manner as in Example 1A to obtain an average photoelectric conversion efficiency for them. Similarly, the solar cells obtained in Example 6B were evaluated in the same manner as in Example 1A to obtain an average photoelectric conversion efficiency for them.

The average photoelectric conversion efficiency in Example 6A was compared with the average photoelectric conversion efficiency in Example 6B by setting the latter at 1. As a result, the average photoelectric conversion efficiency in Example 6A was found to be 1.0 time that in Example 6B.

This result reveals that the average photoelectric conversion efficiency in Example 6A in which the film formation was conducted while continuously moving the web substrate is substantially the same as that in Example 6B in which the film formation was conducted while suspending the transportation of the web substrate. Thus, it is understood that the film formation while continuously moving the web substrate does not invite a substantial reduction in the average photoelectric conversion efficiency for the resulting solar cells.

And the productivity in Example 6A was higher than that in Example 6B because there was adopted the method of continuously forming a semiconductor film on the web substrate which is continuously moving in Example 6A.

In the above, description has been made of the preparation of solar cells having an n-i-p junction structure. But this is not limitative. It is a matter of course to say that the present invention can be desirably adopted in the preparation of solar cells having other semiconductor junction structure such as p-i-n junction structure, $n^+$-$n^-$-$p^+$ junction structure, $n^+$-$p^-$-$p^+$ junction structure, $p^+$-$p^-$-$n^+$ junction structure, $p^+$-$n^-$-$n^+$ junction structure, or the like.

As above detailed, the present invention provides a film-forming apparatus and a film-forming method in which a VHF plasma CVD method capable of performing film deposition at a high speed can be desirably adopted and which make it possible to afford an uniform plasma intensity distribution over a large area even when a bar-like shaped electrode having a small surface area is used as the discharge electrode for the VHF power, where a semiconductor film having a substantially uniform film property in the thickness direction can be efficiently over the entire surface of a large area substrate at a high speed.

TABLE 1

| | vacuum chamber 303 | vacuum chamber 304 | vacuum chamber 305 |
|---|---|---|---|
| oscillation frequecy | 13.56 MHz | 100 MHz | 13.56 MHz |
| discharging wavelength | 2212 cm | 300 cm | 2212 cm |
| length of the film-forming space in the substrate transportation direction | 90 cm (1/25 wavelength) | 75 cm (1/4 wavelength) | 90 cm (1/25 wavelength) |
| electrode form | plate form | bar-like form (the longitudinal direction ⊥ the substrate transportation direction) | plate form |
| film formed | a-Si (n-type) | a-SiGe (i-type) | microcrystalline Si (p-type) |
| film thickness | 20 nm | 100 nm | 10 nm |
| wattage of high frequency power supplied | 200 W | 1500 W | 1500 W |
| bias (D.C.) voltage | | 100 V | |
| raw material gas & its flow rate | $SiH_4$ = 200 sccm $H_2$ = 800 sccm | $SiH_4$ = 200 sccm $GeH_4$ = 200 sccm | $SiH_4$ = 20 sccm $H_2$ = 2000 sccm |

TABLE 1-continued

| | vacuum chamber 303 | vacuum chamber 304 | vacuum chamber 305 |
|---|---|---|---|
| its flow rate | $PH_3$ = 18 sccm | $H_2$ = 1200 sccm | $BF_2$ = 1 sccm |
| substrate temperature | 300° C. | 330 ° C. | 200° C. |
| inner pressure | 133 Pa | 3 Pa | 133 Pa |

TABLE 2

| | vacuum chamber 303 | vacuum Chamber 304 | vacuum chamber 305 |
|---|---|---|---|
| oscillation frequency | 13.56 MHz | 100 MHz | 13.56 MHz |
| diacharging wavelength | 2212 cm | 300 cm | 2212 cm |
| length of the film-forming space in the substrate transportation direction | 90 cm (1/25 wavelength) | 75 cm (1/4 wavelength) | 90 cm (1/25 wavelength) |
| electrode form | plate form | bar-like form (the longitudinal direction ⊥ the substrate transportation direction) | plate form |
| film formed | a-Si (n-type) | a-Si (i-type) | microcrystalline Si (p-type) |
| film thickness | 20 nm | 120 nm | 10 nm |
| wattage of high frequency power supplied | 200 W | 1500 W | 1500 W |
| bias (D.C.) voltage | | 100 V | |
| raw material gas & its flow rate | $SiH_4$ = 200 sccm $H_2$ = 200 sccm $PH_3$ = 18 sccm | $SiH_4$ = 400 sccm $GeH_4$ = 1200 sccm | $SiH_4$ = sccm $H_2$ = 2000 sccm $BF_3$ = 1 sccm |
| substrate temperature | 300° C. | 300° C. | 200° C. |
| inner pressure | 133 Pa | 3 Pa | 133 Pa |

What is claimed is:

1. A film-forming apparatus comprising at least a vacuum chamber having a film-forming space provided therein, a high frequency power supply means, and a raw material gas introduction means and in which a non-single crystalline silicon series semiconductor film is formed on a substrate positioned in said film-forming space by introducing a raw material gas into said film-forming space through said raw material gas introduction means and supplying a high frequency power into said film-forming space through said high frequency power supply means, wherein said high frequency power supply means comprises a bar-like shaped electrode electrically connected to a very high frequency power source, said high frequency power supplied in said film-forming space comprises a very high frequency power, said bar-like shaped electrode is arranged such that the longitudinal direction of said bar-like shaped electrode intersects a direction for said substrate to be moved, and a length of said film-forming space relative to the direction for said substrate to be moved is in a range of from 1/16 to 1/2 of a wavelength of said very high frequency power supplied in said film-forming space.

2. A film-forming apparatus according to claim 1, wherein said substrate comprises a long web substrate.

3. A film-forming apparatus according to claim 1, wherein said bar-like shaped electrode is arranged in said film-forming space such that its longitudinal direction is substantially perpendicular to the direction for said substrate to be moved.

4. A film-forming apparatus according to claim 1, wherein said bar-like shaped electrode is arranged in said film-forming space such that it is situated substantially at a center of the direction for said substrate to be moved.

5. A film-forming apparatus according to claim 1, wherein a direct current power source is also electrically connected to said bar-like shaped electrode so as to supply a desired bias voltage into said film-forming space together with said very high frequency power.

6. A film-forming apparatus according to claim 1, wherein said vacuum chamber having said film-forming space is communicated with other vacuum chambers each having a film-forming space, said substrate comprises a long web substrate which is continuously moved in its longitudinal direction while sequentially passing through said film-forming spaces, wherein a plurality of non-single crystalline silicon series semiconductor films are continuously formed on said long web substrate which is continuously moved while forming a desired non-single crystalline silicon series semiconductor film on said long web substrate by each film-forming space.

7. A film-forming method for forming a non-single crystalline silicon series semiconductor film on a substrate positioned in a film-forming space by introducing a raw material gas into said film-forming space and simultaneously supplying a very high frequency power into said film-forming space, wherein said very high frequency power is supplied through a bar-like shaped electrode, wherein said bar-like shaped electrode is arranged such that the longitudinal direction of said bar-like shaped electrode intersects a direction for said substrate to be moved, and a length of said film-forming space relative to the direction for said substrate to be moved is in a range of from $\frac{1}{16}$ to $\frac{1}{2}$ of a wavelength of said VHF power supplied in said film-forming space.

8. A film-forming method according to claim 7, wherein said substrate comprises a long web substrate.

9. A film-forming method according to claim 7, wherein said bar-like shaped electrode is arranged in said film-forming space such that its longitudinal direction is substantially perpendicular to the direction for said substrate to be moved.

10. A film-forming method according to claim 7, wherein said bar-like shaped electrode is arranged in said film-forming space such that it is situated substantially at a center of the direction for said substrate to be moved.

11. A film-forming method according to claim 7, wherein a desired bias voltage is supplied into said film-forming space together with said very high frequency power.

12. A film-forming method according to claim 7, wherein said film-forming space is communicated with other isolated film-forming spaces, said substrate comprises a long web substrate which is continuously moved in its longitudinal direction while sequentially passing through said film-forming spaces, wherein a plurality of non-single crystalline silicon series semiconductor films are continuously formed on said long web substrate which is continuously moved while forming a desired non-single crystalline silicon series semiconductor film on said long web substrate by each film-forming space.

* * * * *

UNITED STATES PATENT AND TRADEMARK OFFICE
CERTIFICATE OF CORRECTION

PATENT NO. : 6,436,797 B1
DATED : August 20, 2002
INVENTOR(S) : Yasushi Fujioka et al.

It is certified that error appears in the above-identified patent and that said Letters Patent is hereby corrected as shown below:

Title page,
Item [75], Inventors, "Kyotanabe;" should read -- Kyoutanabe; --.

Column 1,
Line 26, "amorphous" should be deleted.

Column 2,
Line 19, "Now" should read -- Now, if --; and
Line 20, "adopt in" should read -- to be employed in --.

Column 3,
Line 29, "efficiently" should read -- efficiently deposited --.

Column 4,
Line 42, "DESCRITION" should read -- DESCRIPTION --.

Column 6,
Line 11, "indicate" should read -- indicates --; and
Line 42, "erated" should read -- erate --.

Column 7,
Line 23, "The" should read -- By the --;
Line 44, "chambered" should read -- chamber --; and
Line 67, "directed" should read -- direction --.

Column 8,
Line 46, "rage" should read -- range --.

UNITED STATES PATENT AND TRADEMARK OFFICE
CERTIFICATE OF CORRECTION

PATENT NO. : 6,436,797 B1
DATED : August 20, 2002
INVENTOR(S) : Yasushi Fujioka et al.

It is certified that error appears in the above-identified patent and that said Letters Patent is hereby corrected as shown below:

Column 9,
Line 34, "has" should read -- have --.

Column 10,
Line 11, "SiFH$_2$," should read -- SiFH$_3$, --;
Line 14, "SiCl$_3$F$_5$" should read -- SiCl$_3$F$_3$ --; and
Line 53, "capable" should read -- capable of --.

Column 11,
Line 20, "FIG. 3" should read -- FIG. 3 is --; and
Line 58, "so to" should read -- so as to --.

Column 12,
Line 4, "provide" should read -- provided --.

Column 13,
Line 36, "case" should read -- cause --; and
Line 40, "312, in" should read -- 312. In --.

Column 14,
Line 40, "procedure" should read -- procedures --.

Column 15,
Line 35, "during" should be deleted;
Line 42, "uneven" should read -- unevenness --; and
Line 61, "l ayer" should read -- layer --.

UNITED STATES PATENT AND TRADEMARK OFFICE
CERTIFICATE OF CORRECTION

PATENT NO. : 6,436,797 B1
DATED : August 20, 2002
INVENTOR(S) : Yasushi Fujioka et al.

It is certified that error appears in the above-identified patent and that said Letters Patent is hereby corrected as shown below:

Column 22,
TABLE 1, "BF, = 1sccm" should read -- $BF_3$ = 1 sccm --; and
TABLE 2, "Chamber" should read -- chamber --;
"diacharging" should read -- discharging --;
"$SiH_4$ - sccm" should read -- $SiH_4$ = 20 sccm --;
"$H_2$ = 200 sccm" should read -- $H_2$ = 800 sccm --;
"wavelength 90 cm 75 cm 90 cm" should read -- wavelength --;
"length of the (1/25 wavelength) (1/4 wavelength) (1/25 wavelength)" should read -- length of the 90 cm 75 cm 90 cm --; and
"film forming" should read -- film forming (1/25 wavelength) (1/4 wavelength) (1/25 wavelength) --.

Signed and Sealed this

Eleventh Day of February, 2003

JAMES E. ROGAN
*Director of the United States Patent and Trademark Office*